United States Patent
Lin et al.

(10) Patent No.: US 12,353,143 B2
(45) Date of Patent: Jul. 8, 2025

(54) RETICLE OF PROTECTING FROM PARTICLE ATTACKS

(71) Applicant: TAIWAN SEMICONDUCTOR MANUFACTURING COMPANY, LTD., Hsinchu (TW)

(72) Inventors: Yao-Tang Lin, Hsinchu (TW); Tzu-Wen Chen, Hsinchu (TW); Jian-Yuan Su, Hsinchu (TW); Ming-Hsin Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 215 days.

(21) Appl. No.: 18/138,004

(22) Filed: Apr. 21, 2023

(65) Prior Publication Data

US 2024/0353763 A1    Oct. 24, 2024

(51) Int. Cl.
*G03F 7/00*    (2006.01)

(52) U.S. Cl.
CPC ...... *G03F 7/70916* (2013.01); *G03F 7/70983* (2013.01)

(58) Field of Classification Search
CPC .... G03F 7/70916; G03F 7/70983; G03F 1/22; G03F 1/48; G03F 1/76
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 10,627,714 B2 | 4/2020 | Ji et al. |
| 2004/0145716 A1* | 7/2004 | Wu ............. G03F 7/70933 430/311 |
| 2005/0105074 A1 | 5/2005 | Lee et al. |
| 2006/0017895 A1* | 1/2006 | Sogard ........... G03F 7/70875 355/75 |
| 2008/0251100 A1 | 10/2008 | Shimada et al. |
| 2020/0209735 A1 | 7/2020 | Ji et al. |
| 2021/0018853 A1* | 1/2021 | Cheng ............ G03F 7/70066 |

FOREIGN PATENT DOCUMENTS

| | | |
|---|---|---|
| EP | 1892570 A2 | 2/2008 |
| TW | 200516355 A | 5/2005 |

* cited by examiner

*Primary Examiner* — Peter B Kim
(74) *Attorney, Agent, or Firm* — STUDEBAKER BRACKETT PLLC

(57) ABSTRACT

A reticle includes a border section surrounding a pattern section, and gas openings arranged in and passing through the border section. The gas openings are coupled to a gas supply. Each gas opening extends in a first direction inclined to and forming an angle with a reticle center axis that extends perpendicularly away from a front surface of the reticle, and is configured to blow a pressurized gas in the first direction away from the front surface to create an air wall adjacent to and surrounding the front surface, thereby advantageously preventing particles from falling on the front surface of the reticle.

20 Claims, 13 Drawing Sheets

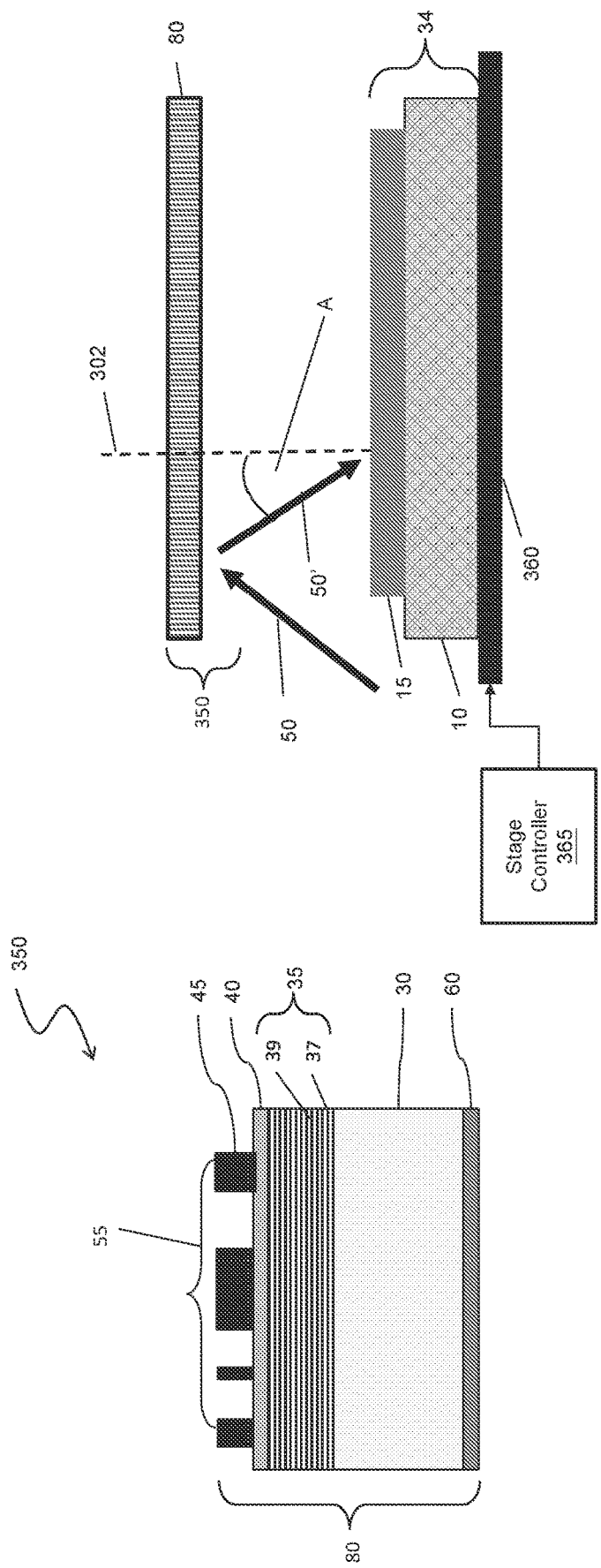

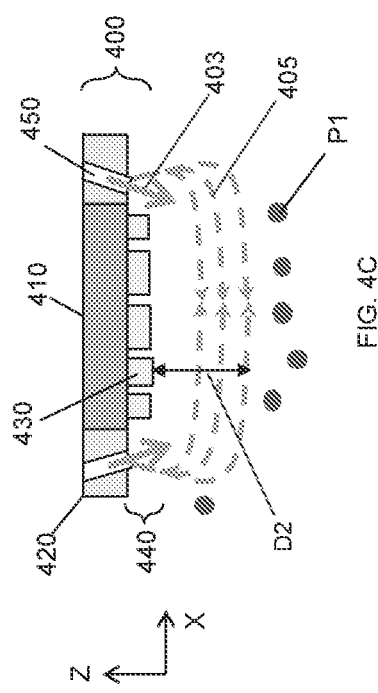
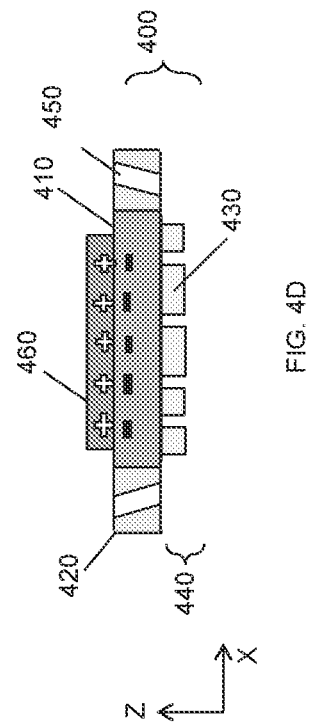
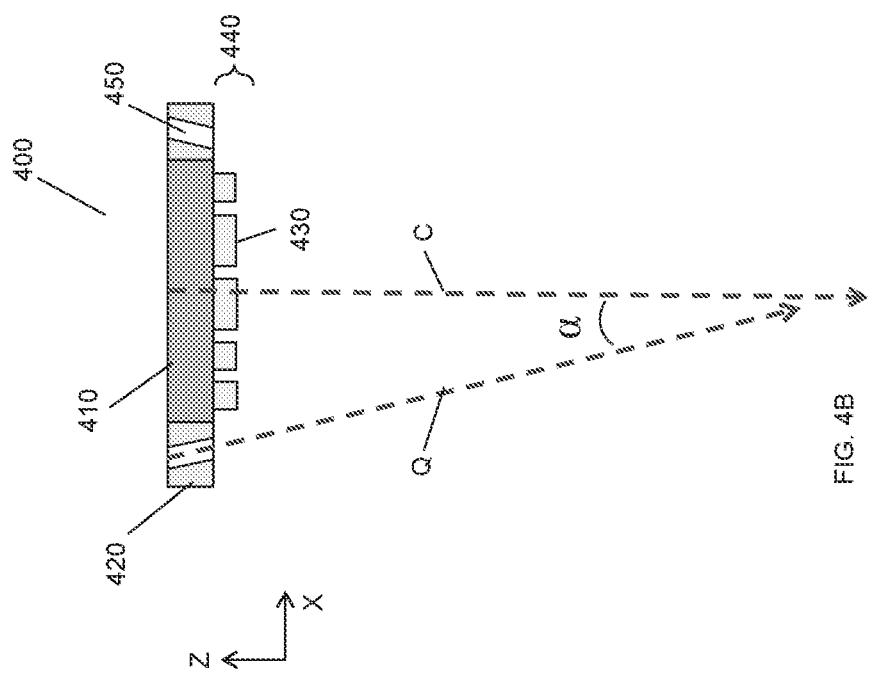

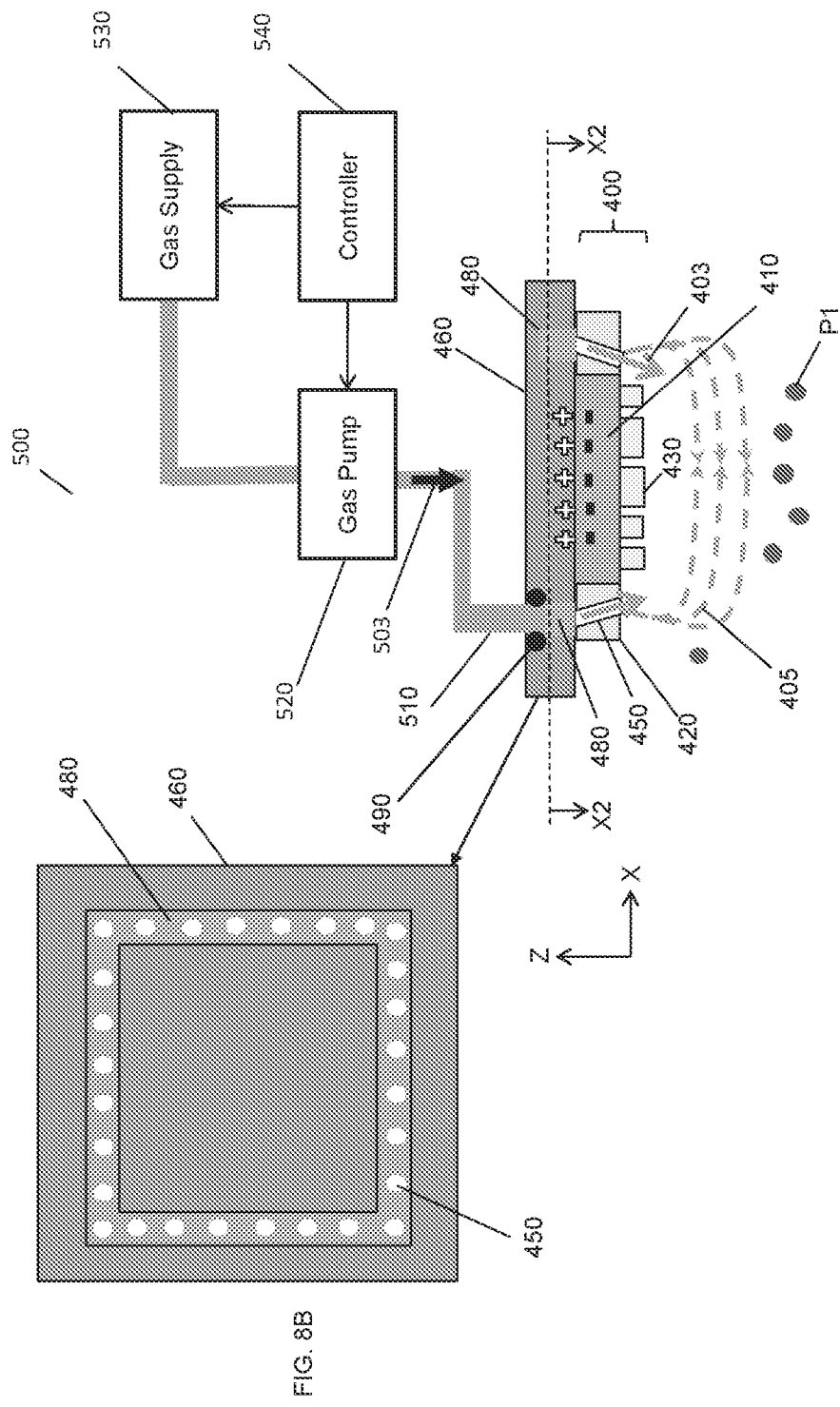

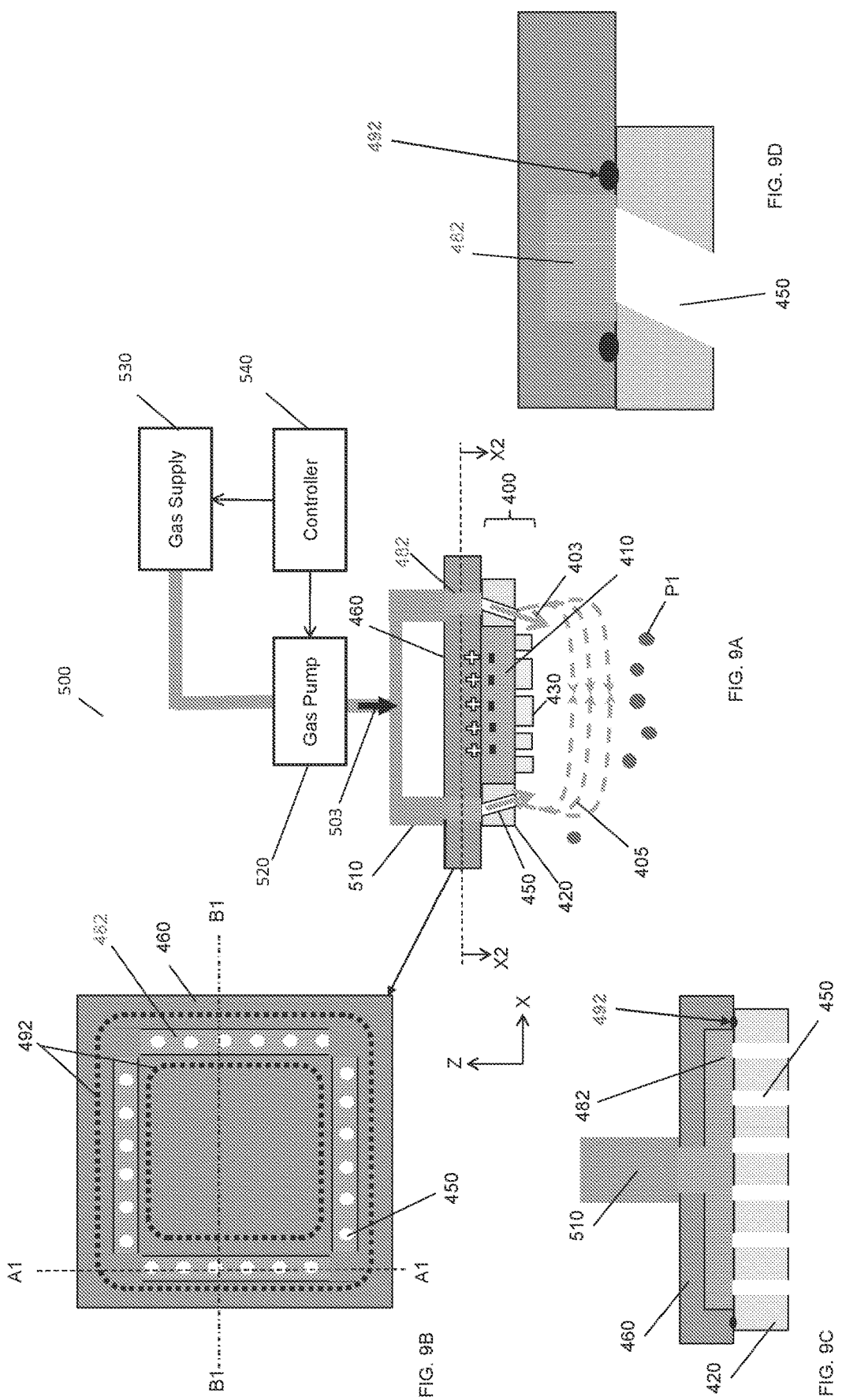

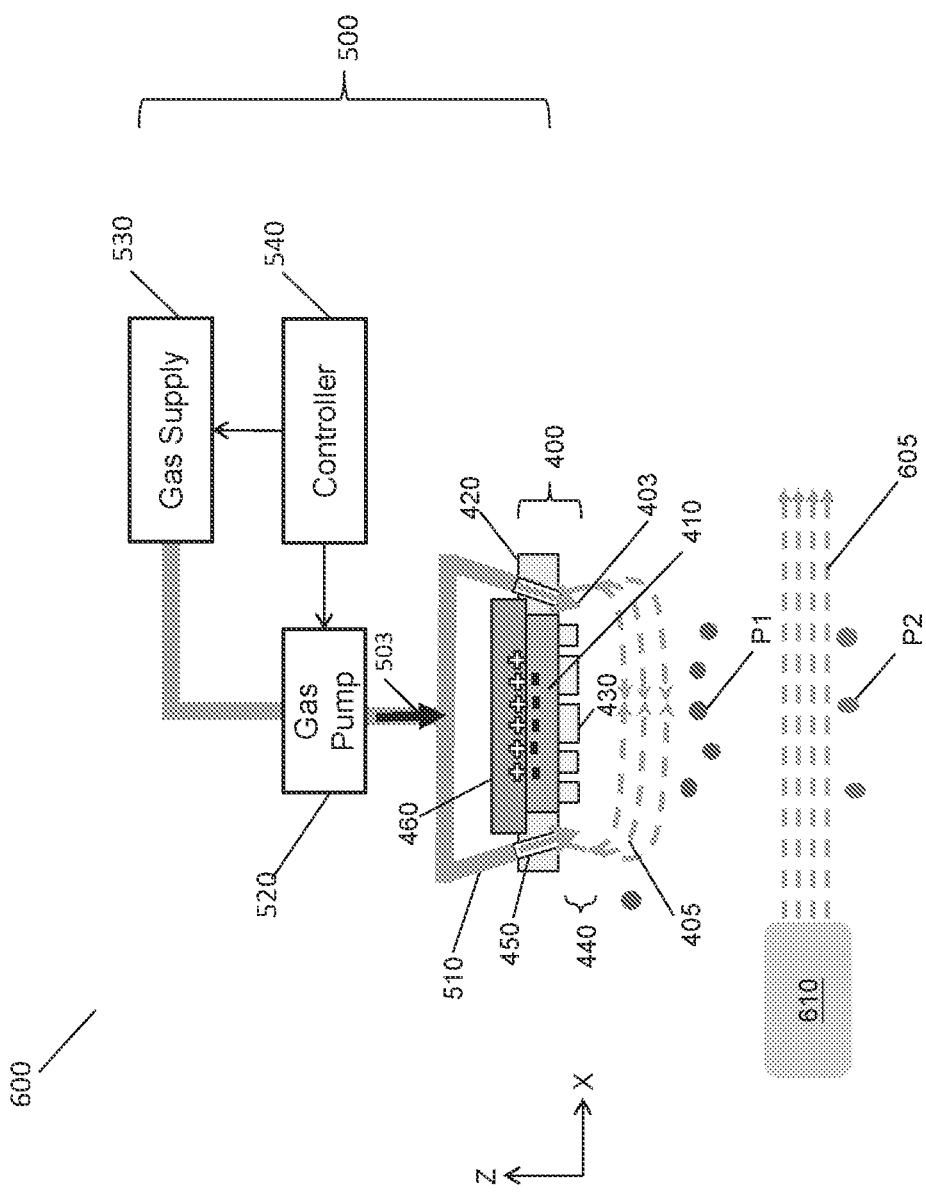

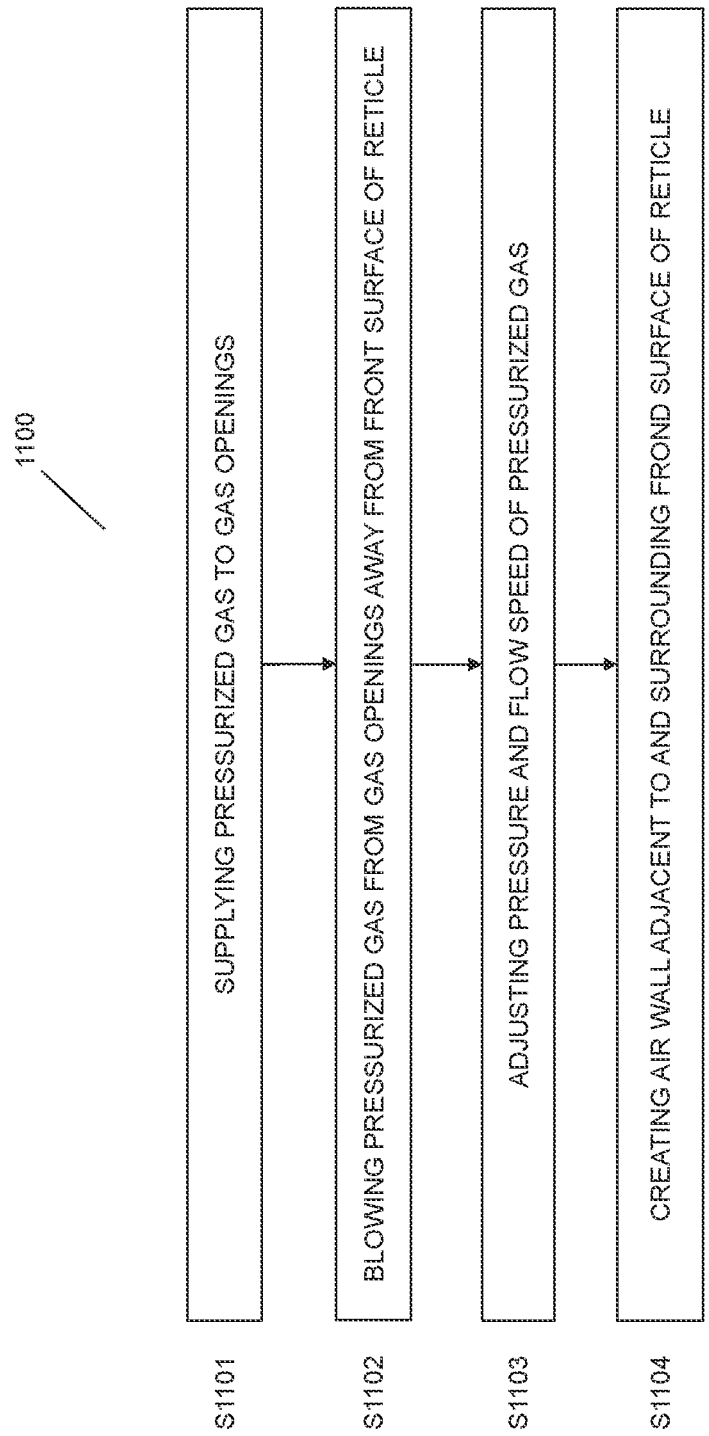

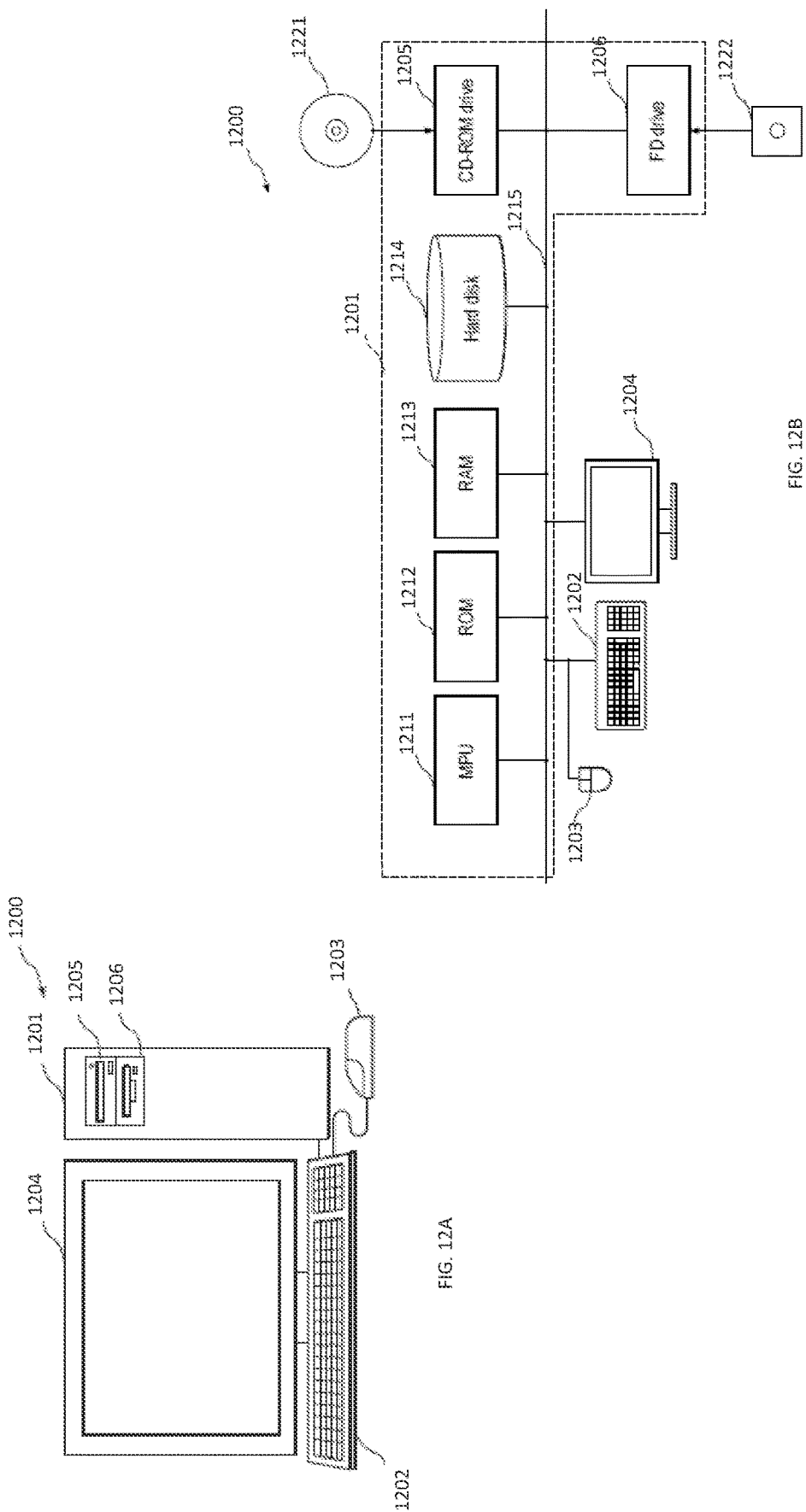

RETICLE OF PROTECTING FROM PARTICLE ATTACKS

BACKGROUND

During an integrated circuit (IC) design, a number of patterns of the IC, for different steps of IC processing, are generated on a substrate. The patterns may be produced by projecting patterns of a photomask on a photoresist layer of a wafer. A lithography process transfers the patterns of the photomask to the photoresist layer of the substrate such that etching, implantation, or other steps are applied only to predefined regions of the substrate. Transferring the patterns of the photomask to the photoresist layer may be performed e.g., using an extreme ultraviolet (EUV) radiation source to expose the photoresist layer of the substrate. During the lithography process, a photomask is prone to be hit by particles from various sources. A photomask that is protected against possible particles is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show cross-sectional views of a reflective reticle structure and projecting the reflective reticle structure on a semiconductor device in accordance with some embodiments of the present disclosure.

FIGS. 4B, 4C and 4D show cross-sectional views of the reticle along a cross-section line X1-X1 illustrated in FIG. 4A.

FIG. 8A shows a view of a system for creating an air wall to protect a reticle from falling-on particles in accordance with some embodiments of the present disclosure. FIG. 8B shows a cross-sectional view (or a plan or projected view) of a reticle stage along a cross-section line X2-X2 illustrated in FIG. 8A.

FIG. 9A shows a view of a system for creating an air wall to protect a reticle from falling-on particles in accordance with some embodiments of the present disclosure. FIG. 9B shows a cross-sectional view (or a plan or projected view) of a reticle stage along a cross-section line X2-X2 illustrated in FIG. 9A. FIG. 9C shows a cross-sectional view of the reticle stage and the reticle along a cross-section line A1-A1 illustrated in FIG. 9B. FIG. 9D shows an enlarged cross-sectional view of the reticle stage and the reticle along a cross-section line B1-B1 illustrated in FIG. 9B.

FIG. 10 shows a view of another system for creating an air wall to protect a reticle from falling-on particles in accordance with another embodiment of the present disclosure.

FIG. 11 shows a flowchart of a method of creating an air wall to protect a reticle from falling-on particles in accordance with an embodiment of present disclosure.

FIGS. 12A and 12B illustrate an apparatus for creating an air wall to protect a reticle from falling-on particles in accordance with some embodiments of the present disclosure.

DETAILED DESCRIPTION

Figure 1:
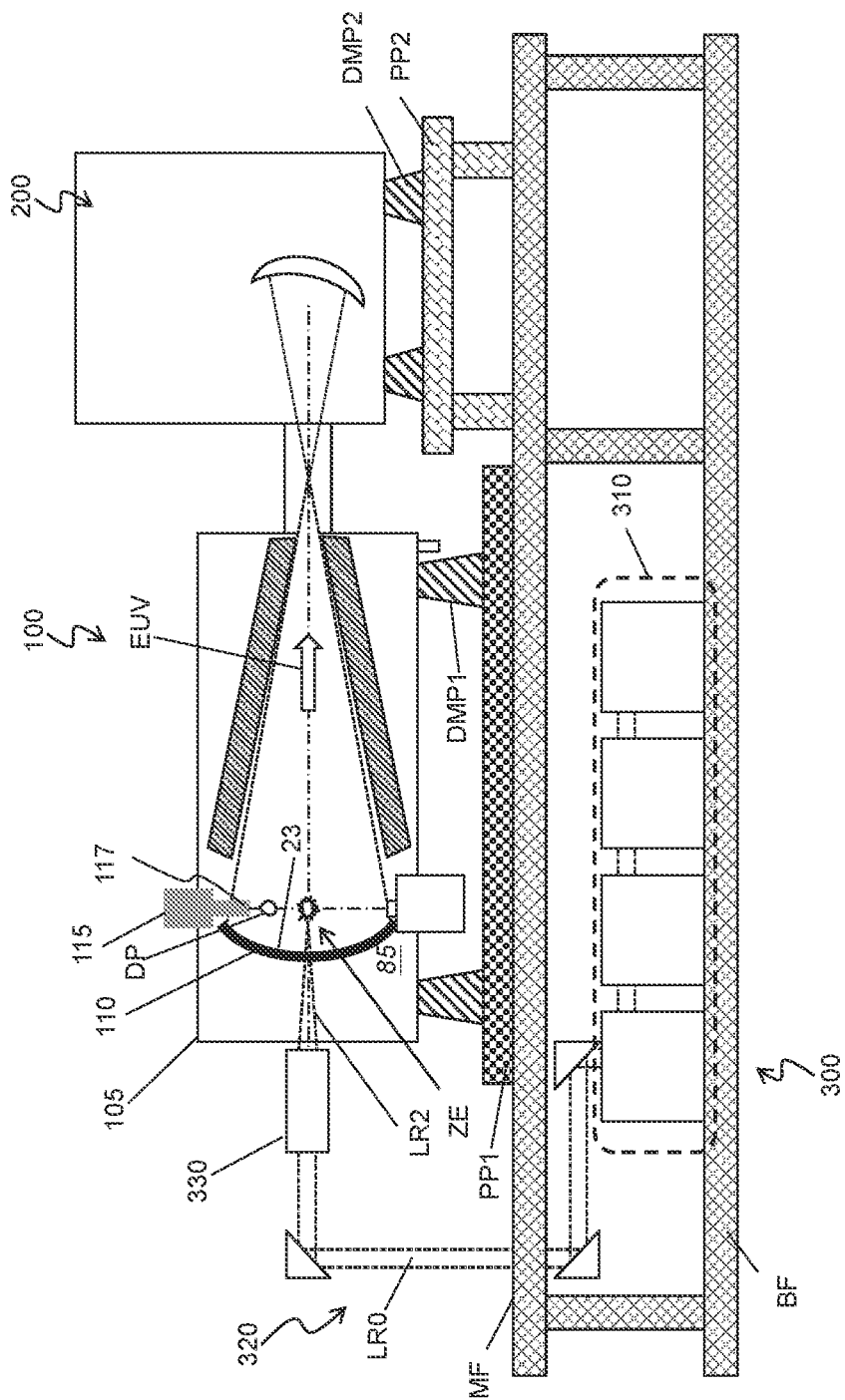
FIG. 1 shows a schematic view of an extreme ultraviolet (EUV) lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

During an EUV exposure process, in an EUV lithography exposure tool (such as an EUV lithography scanner), a reticle likely suffers from falling-on particles from various sources, such as particles from an EUV radiation source, particles induced by a reticle stage due to a relative movement between the reticle stage and the reticle, particles produced by an intended protection mechanism attempting to protect the reticle from falling-on particles, and particles with high momentums passing through the intended protection mechanism. The particles falling on the reticle may subsequently result in e.g., repeated defects that are projected on the wafer, thereby disadvantageously affecting wafer yield.

A pellicle mounted on to a reticle is an option for protecting the reticle against falling-on particles. However, an improved pellicle is still under development to possess high strength and high transparency to an EUV radiation, for example. Other options for protecting a reticle against falling-on particles are desirable.

In the present disclosure, in some embodiments, a reticle includes a border section surrounding a pattern section, and gas openings arranged in and passing through the border section and coupled to a gas supply. Each gas opening extends in a first direction inclined to and forming an angle with a reticle center axis that extends perpendicularly away from a front surface of the reticle, and is configured to blow a gas in the first direction away from the front surface to create an air wall adjacent to and surrounding the front surface of the reticle.

In the present disclosure, in some embodiments, a method of creating an air wall to protect a reticle includes supplying a gas from a gas supply to the plurality of gas openings via a plurality of tubes respectively, blowing the gas from each gas opening in the first direction away from the front surface, adjusting a pressure and a flow speed of the gas by a gas pump, and creating the air wall adjacent to and surrounding the front surface, thereby effectively preventing particles from falling on the front surface of the reticle and thus improving clearness of the retile without using a pellicle. Therefore, wafer yield can be advantageously raised by about 0.5% for example.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2. In some embodiments, a mask is transferred into the exposure device 200. As noted, the exposure device 200 is maintained under a vacuum environment and the mask is mounted over a substrate, with a photo resist layer disposed on the substrate. The mask has a pellicle mounted over the reticle. After transferring the mask with the pellicle into the exposure device 200, the air pressure in the enclosure between the reticle and the pellicle is equalized with the vacuum environment of the exposure device 200 through the holes in the mounting fixture (the frame). The EUV radiation generated by the EUV radiation source 100 is directed by the optical components to project the mask on the photo resist layer of the substrate. In some embodiments, after the exposure of the mask on the photo resist layer of the substrate, the reticle with the pellicle is transferred out of the exposure device 200. After transferring the reticle with the pellicle out of the exposure device 200, the air pressure in the enclosure between the reticle and the pellicle is equalized with the atmospheric pressure outside the exposure device 200 through the holes in the mounting fixture.

In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask. The mask is described with respect to FIG. 3A.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by to, the time at which EUV radiation is generated (and detected) is denoted by $t_{rad}$, and the distance between the position at which the passage of the target droplet is detected and a center of the zone of excitation is d. the speed of the target droplet, $v_{dp}$, is calculated as:

$$v_{dp}=d/(t_{rad}-t_o) \qquad \text{equation (1).}$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
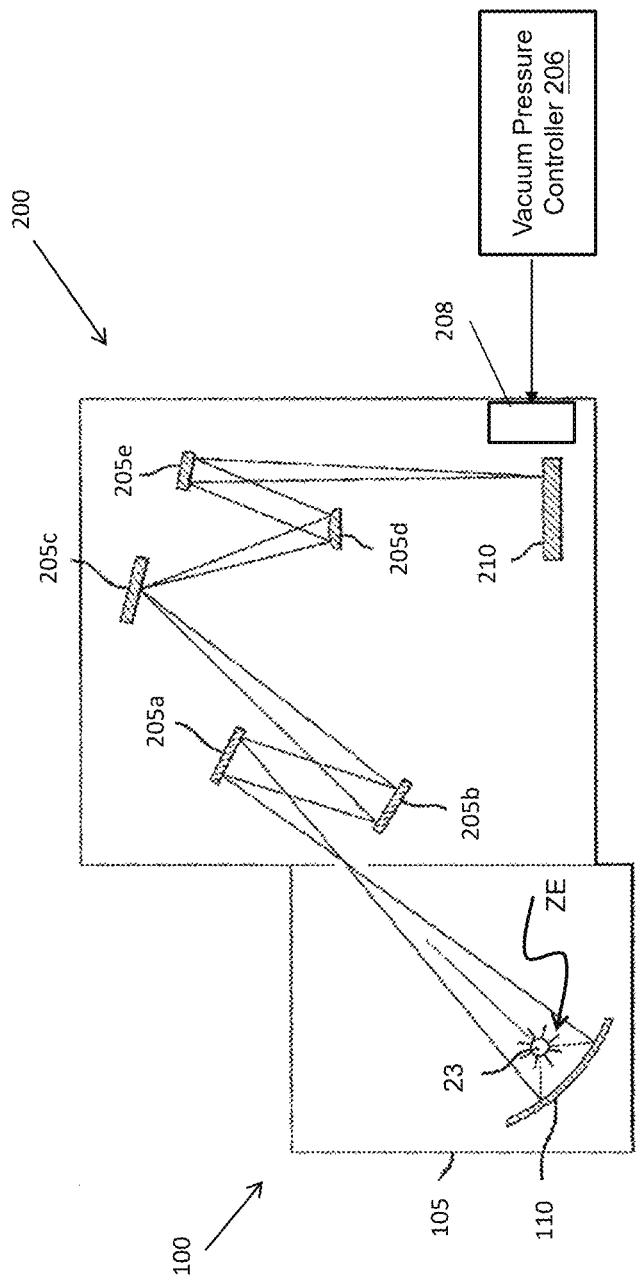
FIG. 2 shows a schematic view of an EUV lithography exposure tool in accordance with some embodiments of the present disclosure.

FIG. 2 shows a schematic view of an EUV lithography (EUVL) exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., the reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, a pressure inside the exposure device 200 is sensed by a pressure sensor 208 inside the exposure device 200 and is controlled by a vacuum pressure controller 206 that is coupled to the exposure device 200.

As noted above, because gas molecules absorb EUV light, the lithography system for the EUV lithography patterning, e.g., the exposure device 200, is maintained in a vacuum environment to avoid EUV intensity loss. After transferring the reticle with the pellicle into the exposure device 200, the air pressure in the enclosure between the reticle and the pellicle is equalized with the vacuum environment of the exposure device 200 through the holes in the mounting fixture (the frame), and thus vacuum is produced in the enclosure between the reticle and the pellicle. In some embodiments, after the exposure of the mask on the photo resist layer of the substrate, the reticle with the pellicle, the reticle structure, is transferred out of the exposure device 200. After transferring the reticle with the pellicle out of the exposure device 200, the vacuum in the enclosure between the reticle and the pellicle is equalized with the atmospheric pressure outside the exposure device 200 through the holes in the mounting fixture and, thus, atmospheric pressure in produced in the enclosure between the reticle and the pellicle.

FIGS. 3A and 3B show a cross-sectional view of a reflective reticle structure 350, e.g., a reticle system, and projecting the reflective reticle structure 350 on a semiconductor device in accordance with some embodiments of the present disclosure.

FIG. 3A shows a cross-sectional view of a reflective reticle structure 350 that includes a reticle 80, e.g., a reflective mask, among other things. As noted above, the terms mask, photomask, and reticle may be used interchangeably. In some embodiments, the reticle 80 is a reflective mask and is used as part of the reflective reticle structure 350. The reflective reticle structure 350 is consistent with reflective mask 205c of FIG. 2 and is used in the exposure device 200 of FIG. 2.

The reticle 80 includes a substrate 30, reflective multiple layers (ML) 35 that are deposited on the substrate 30, a conductive backside coating 60, a capping layer 40, and an absorption layer 45. In some embodiments, the material of the substrate 30 includes $TiO_2$ doped $SiO_2$, or other suitable materials with low thermal expansion. In some embodiments, the substrate 30 includes fused quartz and has a thickness between about 6 mm to about 7 mm.

In some embodiments, the ML 35 includes a plurality of film pairs, such as molybdenum-silicon (Mo/Si) film pairs (e.g., a layer of molybdenum layer 39 above or below a layer of silicon layer 37 in each film pair). In some embodiments, the ML 35 has 40 to 50 pairs of the molybdenum layer 39 and the silicon layer 37 and each molybdenum layer 39 has a thickness of 3 nm and each silicon layer 37 has a thickness of 4 nm. Thus, in some embodiments, the ML 35 has a thickness between 280 nm to 350 nm. Alternatively, the ML 35 may include molybdenum-beryllium (Mo/Be) film pairs, or other suitable materials that are configured to highly reflect the EUV light.

The capping layer 40 may include ruthenium (Ru) and may be disposed on the ML 35 for protection and may have a thickness of 2.5 nm. In some embodiments, the capping layer 40 may include silicon (Si) and may be disposed on the ML 35 for protection and may have a thickness of 4 nm. In some embodiments, the absorption layer 45 that includes a tantalum boron nitride (TaBN) layer is deposited over the ML 35 and the capping layer 40.

In some embodiments, the absorption layer 45 is patterned into pattern features 55 to define a layout pattern for layer of an integrated circuit (IC). In some embodiments, the backside coating 60 includes chromium nitride (CrN) or tantalum boride (TaB) and has a thickness of about 20 nm to about 100 nm. In some embodiments, the absorption layer 45 includes one or a combination of TaBO, TaBN, TaNO, and TaN and has a thickness between 50 nm and 70 nm.

FIG. 3B shows exposing the photoresist of a semiconductor device to radiation in accordance with some embodiments of the present disclosure. FIG. 3B shows the semiconductor device 34 includes a photoresist layer 15 that is disposed on a semiconductor substrate 10. FIG. 3B also shows a radiation beam 50 that is originated from an EUV light source, e.g., EUV light source 100 of FIG. 1. The radiation beam 50 is directed to the reticle 80, e.g., a reflective photomask, where the radiation beam 50' is reflected from the reflective photomask 80 and is incident onto the photoresist layer 15. The incident angle of the radiation beam 50', which is defined with respect to a line 302 that is perpendicular to a top surface of the semiconductor substrate 10 is angle A. In some embodiments, the semiconductor substrate 10, consistent with the semiconductor substrate 210 of FIG. 2, is mounted on a stage 360 that is coupled to and controlled by a stage controller 365 for moving the semiconductor device 34 and exposing different locations of the semiconductor device 34.

Figure 4A:
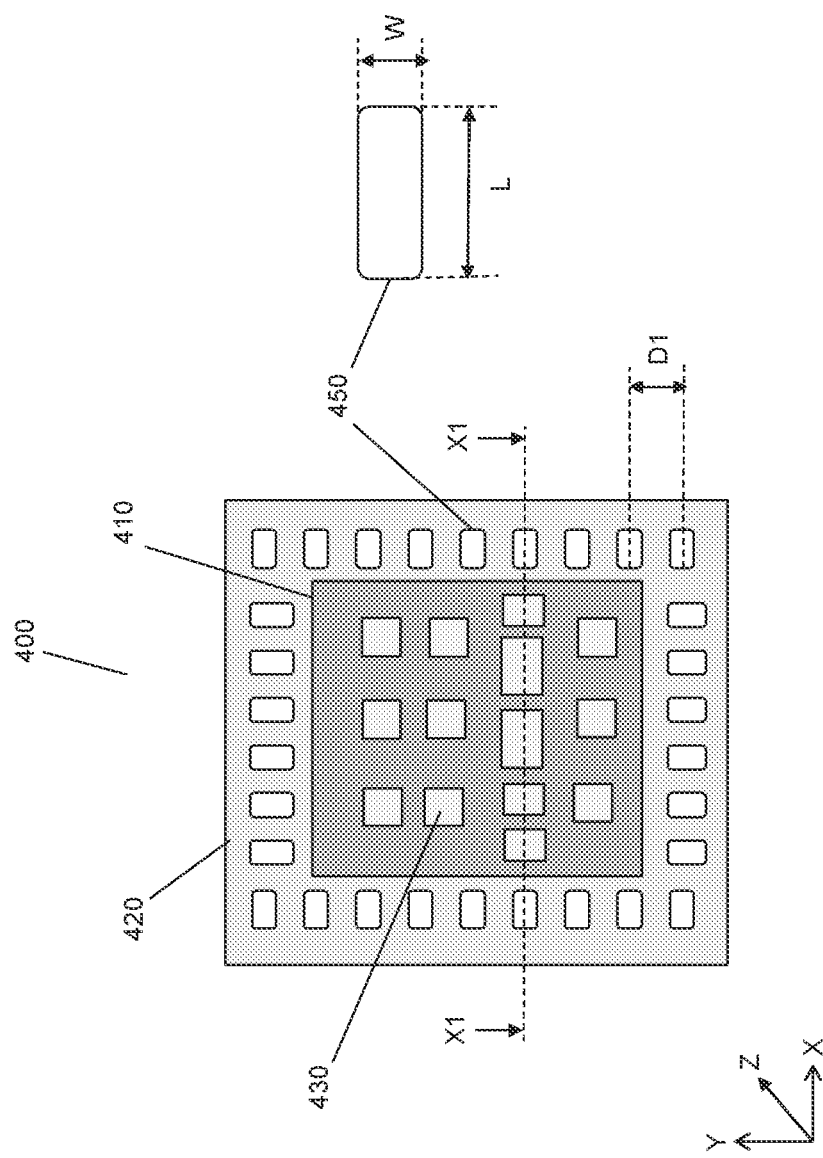
FIG. 4A shows a top plan view of a reticle for creating an air wall to protect the reticle from falling-on particles in accordance with some embodiments of the present disclosure.

FIG. 4A shows a top plan view of a reticle 400 for creating an air wall to protect the reticle in accordance with some embodiments of the present disclosure. FIGS. 4B, 4C and 4D show cross-sectional views of the reticle 400 along a cross-section line X1-X1 illustrated in FIG. 4A. The reticle 400 in FIGS. 4A-4D is consistent with the reticle 80 of the reticle structure 350 in FIGS. 3A and 3B and the reflective mask 205c in FIG. 2. The terms of reticle, photomask, and mask are interchangeably used in the present disclosure.

During an EUV exposure process, in an EUV exposure device 200 (in FIG. 2), a reticle 400 likely suffers from falling-on particles (e.g., P1 in FIG. 4C) produced or coming from various sources, such as an EUV radiation source 100 (in FIG. 1), and a reticle stage 460 (in FIG. 4D) holding the reticle 400, etc. In some embodiments, the falling-on particles include particles of Sn, AlO (such as $Al_2O_3$), Fe, Ni, SiC, and/or $C_xH_yO_z$. Here, in a $C_xH_yO_z$ structure, x is a value between 0 and 4, y is a value between 0 and 4, z is a value between 0 and 4, and x+y+z=4.

In some embodiments, as shown in FIGS. 4A-4D, a reticle 400 includes a pattern section 410 and a border section 420. The pattern section 410 includes a plurality of circuit patterns 430 formed thereon. The border section 420 surrounds the pattern section 410, and includes a plurality of gas openings 450 arranged in and passing through the border section 420. In some embodiments, as shown in FIG. 4A, the plurality of gas openings 450 are equally-spaced and in parallel with border edges in the border section 420.

In some embodiments, as shown in FIG. 4B, each of the plurality of gas openings 450 extends in a first direction Q that is tilted or inclined to and forms an angle α with a reticle center axis C, which extends perpendicularly away from a front surface 440 of the reticle 400. In some embodiments, the reticle center axis C extends approximately in a gravity direction.

In an embodiment, the angle α formed between the first direction Q and the reticle center axis C is in a range from about 25 degrees to about 50 degrees. In another embodiment, the angle α is in a range from about 30 degrees to about 45 degrees. In still another embodiment, the angle α is in a range from about 35 degrees to about 40 degrees.

In some embodiments, a shape of each gas opening 450 is a rectangle (in FIG. 4A), a square, a circle, an ellipse, or others. In some embodiments, as shown in FIG. 4A, a shape of each gas opening 450 is a rectangle with rounded corners, a length L of the rectangle is in a range from about 45 mm to about 55 mm, and a width W of the rectangle is in a range from about 0.8 mm to about 1.2 mm.

In some embodiments, a size of each gas opening 450 is in a range from about 45 mm$^2$ to about 55 mm$^2$. In some embodiments, a ratio of a total area of the plurality of gas openings 450 to an area of the border section 420 of the reticle 400 is in a range from about 40% to about 75%.

In some embodiments, as shown in FIG. 4C, each of the plurality of gas opening 450 blows a gas 403 in the first direction Q (in FIG. 4B) to create an air wall 405 that is adjacent to and surrounds the front surface 440 of the reticle 400, thereby effectively preventing particles (such as particles P1) from falling on the front surface 440 of the reticle 400. In some embodiments, the gas 403 includes a helium gas, an argon gas, a xenon gas, a hydrogen gas, a nitrogen gas, a clean dry air (CDA), a combination of argon and hydrogen gases, a combination of nitrogen and hydrogen gases, or the like.

In some embodiments, as shown in FIG. 4A, a distance D1 between two adjacent gas openings 450 in the border section 420 of the reticle 400 is in a range from about 20 mm to about 40 mm, and is in a range from about 25 mm to about 35 mm in other embodiments.

As shown in FIG. 4D, in some embodiments, the reticle 400 is held by a reticle stage 460 with the aid of attractive electrostatic force due to opposite electrical charges respectively collected in the reticle 400 and the reticle stage 460. In some situations, relative movements between the reticle 400 and the reticle stage 460 may cause particles that may fall on the front surface 440 of the reticle 400 and thus should be prevented.

In some embodiments, as shown in FIG. 4C, a distance D2 between an outmost point of the created air wall 405 and an outmost point of the front surface 440 is in a range from about 5 mm to about 6 mm. Such a short distance D2 can advantageously prevent adjacent particles (such as particles induced by the relative movements between the reticle 400 and the reticle stage 460) from falling on the front surface 440 of the reticle 400.

Figure 5:
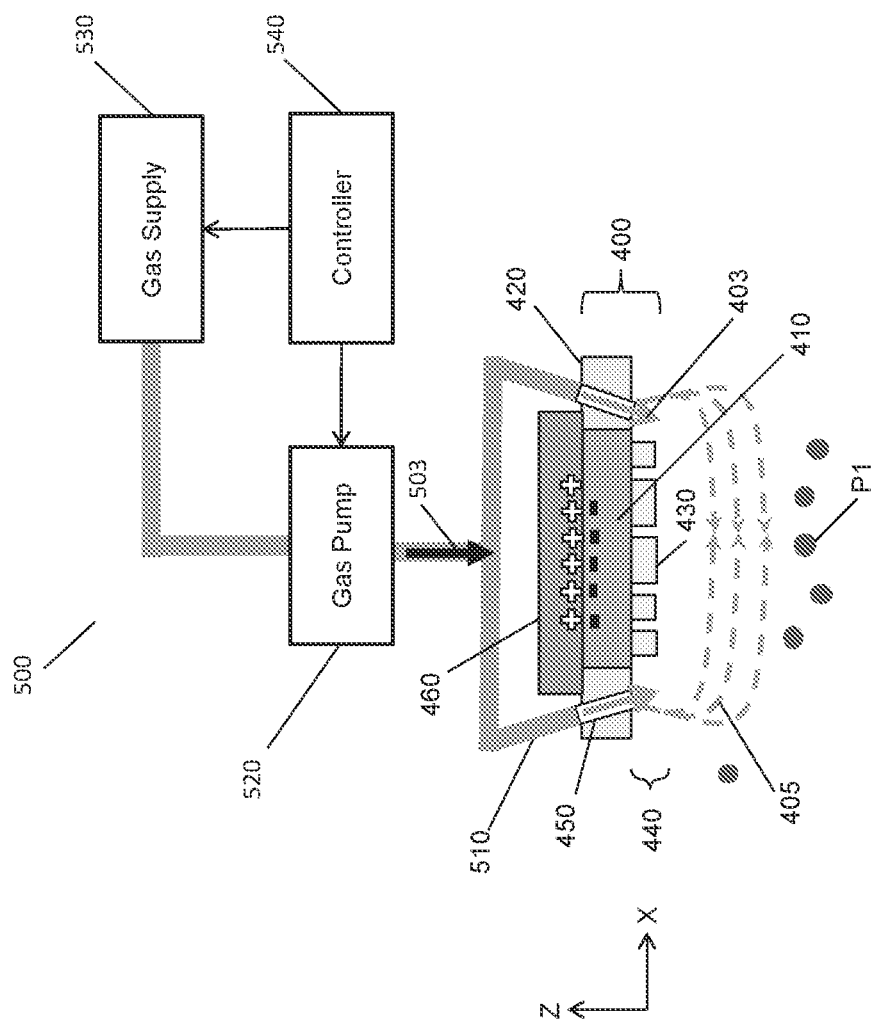
FIGS. 5, 6 and 7 show views of systems for creating air walls to protect reticles from falling-on particles in accordance with some embodiments of the present disclosure.
Figure 6:
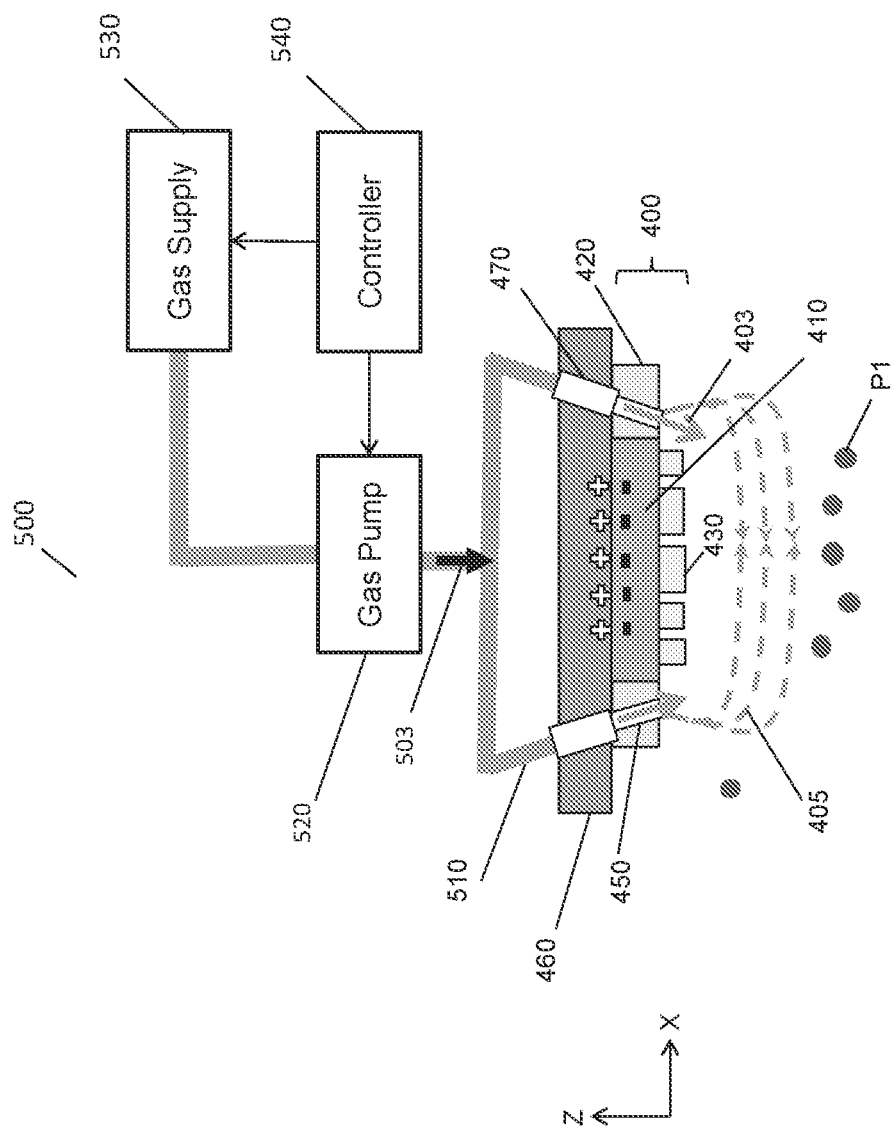
Figure 7:
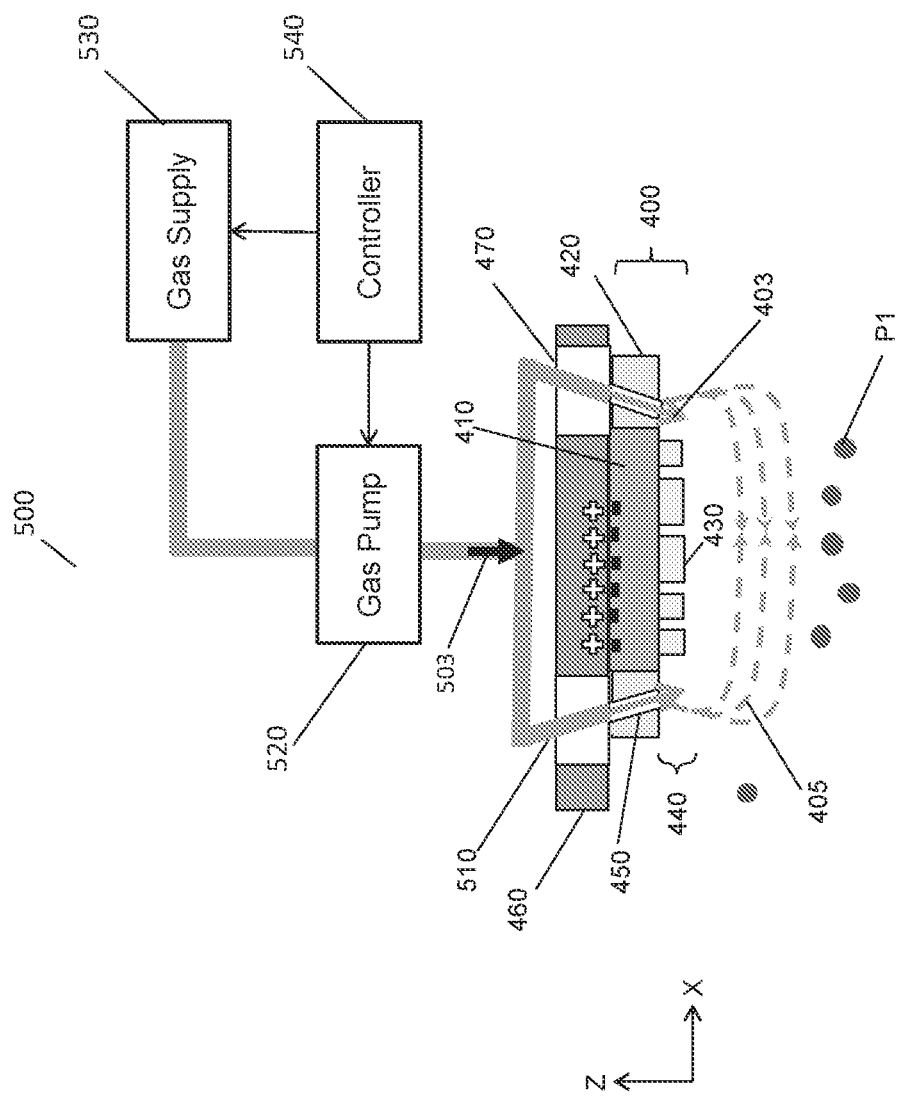

FIGS. 5, 6 and 7 show views of systems 500 for creating air walls to protect reticles 400 in accordance with some embodiments of the present disclosure.

In some embodiments, a system 500 includes a reticle 400, a gas supply 530, a plurality of gas tubes (or pipes) 510 coupled to the gas supply 530 and the reticle 400, a gas pump 520 coupled to the gas supply 530 and the plurality of gas tubes 510, and a controller 540 coupled to and configured to control the gas supply 530 and the gas pump 520. A flow regulator is used instead of or in addition to the gas pump in some embodiments.

In some embodiments, as shown in FIGS. 5-7, the reticle 400 includes a pattern section 410 including a plurality of circuit patterns 430, and a border section 420 surrounding the pattern section 410 and including a plurality of gas openings 450. The plurality of gas openings 450 are arranged in and passing through the border section 420, and are coupled to the gas supply 530 via the plurality of tubes 510 respectively.

As shown in FIGS. 5-9A, in some embodiments, the plurality of gas openings 450 are coupled to the gas supply 530 via one or more tubes 510, thereby being supplied with a gas 503 from the gas supply 530.

In some embodiments, the gas 503 includes a helium gas, an argon gas, a xenon gas, a hydrogen gas, a nitrogen gas, a clean dry air (CDA), or the like. In some embodiments, the gas 503 includes a combination of argon and hydrogen gases, and a volume ratio of the argon gas and the hydrogen gas in the combination is in a range from about 0.9 to about 1.1. In some embodiments, the gas 503 includes a combination of nitrogen and hydrogen gases, and a volume ratio of the nitrogen gas and the hydrogen gas in the combination is in a range from about 0.9 to about 1.1.

In some embodiments, as shown in FIGS. 5-9A, the controller 540 is configured to control the gas pump 520 and the gas supply 530 to adjust a pressure and a flow speed of the gas 503 in order to properly form the air wall 405. In some embodiments, a pressure of the gas 503 supplied into the gas openings 450 is in a range from about 0.5 atm to about 1.5 atm. In some embodiments, a flow speed of the gas 503 that is blown out through the gas openings 450 is in a range from about 1 liter/minute to about 5 liter/minute.

Among other things, the adjusted pressure and flow speed of the gas 503, as well as the angle α formed between the first direction Q and the reticle center axis C, contribute to create the air wall 405 advantageously adjacent to and surrounding the front surface 440 of the reticle 400.

In some embodiments, as shown in FIG. 4C, a short distance D2 between an outmost point of the air wall 405 and an outmost point of the front surface 440 of the reticle 400 is in a range from about 5 mm to about 6 mm, thereby advantageously preventing adjacent particles (such as particles induced by relative movements between the reticle 400 and the reticle stage 460) and other particles from falling on the front surface 440 of the reticle 400.

As shown in FIGS. 5, 6 and 7, a plurality of tubes 510 can be coupled to the plurality of gas openings 450 in various ways. As shown in FIG. 5, in an embodiment, the tubes 510 pass around (rather than passing through) the retile stage 460, and are coupled to the gas openings 450. As shown in FIG. 6, in another embodiment, the tubes 510 are coupled to openings 470 of the retile stage 460 that pass through the retile stage 460, and the tubes 510 are subsequently coupled to the gas openings 450 of the reticle 400 via the openings 470 of the reticle stage 460. As shown in FIG. 7, in still another embodiment, the tubes 510 merely pass through (but not coupled to or in gas connection with) the openings 470 of the retile stage 460, and are coupled to the gas openings 450 of the reticle 400.

In some embodiments, the tubes 510 are coupled to and correspond to the gas openings 450 respectively, the number of the tubes 510 and the number of the gas openings 450 being the same. In other embodiments, the tubes 510 are coupled to and correspond to some of the gas openings 450 respectively, the number of the tubes 510 being less than the number of the gas openings 450. In some embodiments, annular gaskets or O-shaped rings (not shown) are used to ensure the corresponding gas openings 450 and tubes 510 are air-tightly connected.

In some embodiments, the reticle 400 is mounted onto or taken off from the reticle 460 by an arm robot (not shown). In some situations, after the reticle 400 being mounted onto the reticle stage 460 and before the EUVL exposure process, the arm robot automatically connects the tubes 510 to the corresponding gas openings 450 of the reticle 400 or the corresponding openings 470 of the reticle stage 460. In other situations, after the EUVL exposure process and before the reticle 400 being taken off from the reticle stage 460, the arm robot automatically disconnects the tubes 510 from the corresponding gas openings 450 or the corresponding openings 470 of the reticle stage 460.

FIG. 8A shows a view of a system for creating an air wall to protect a reticle from falling-on particles, and FIG. 8B shows a cross-sectional view of a reticle stage along a cross-section line X2-X2 illustrated in FIG. 8A. In some embodiments, the reticle stage 460 includes a chamber 480 formed therein. The chamber 480 is open to all of the plurality of gas openings 450 of the reticle 400, and is capable of being air-tightly connected to a tube 510 by an arm robot (not shown) using one or more O-rings 490. In this way, the plurality of gas openings 450 of the reticle 400 can be air-tightly connected to the tube 510 via the chamber 480 of the reticle stage 460. The position at which the chamber 480 of the reticle stage 460 is connected to the tube 510 is not limited to the position at a top of the reticle stage 460 as shown in FIG. 5D, and may be on other positions at a side or a bottom of the reticle stage 460 (not shown).

FIG. 9A shows a view of a system for creating an air wall to protect a reticle from falling-on particles in accordance with some embodiments of the present disclosure. FIG. 9B shows a cross-sectional view of a reticle stage along a cross-section line X2-X2 illustrated in FIG. 9A. FIG. 9C shows a cross-sectional view of the reticle stage and the reticle along a cross-section line A1-A1 illustrated in FIG. 9B. FIG. 9D shows a cross-sectional view of the reticle stage and the reticle along a cross-section line B1-B1 illustrated in FIG. 9B. In some embodiments, two or more (e.g., four) chambers 482 are provided to the reticle stage 460. FIG. 5E also shows a plan view, cross sectional views A1-A1 and B1-B1 and an enlarged cross sectional view. In some embodiments, two or more (e.g., four) branches of the tube 510 are coupled to the respective chambers, and each chamber is coupled to the corresponding ones (group) of gas openings 450 in the reticle. The branches of pipe 510 is detachably coupled to or fixed to the reticle stage. In some embodiments, at least the branches of the tube or the entire tube 510 are made of a flexible material (e.g., plastic). In some embodiments, two O-rings or gaskets 492 are provided between the reticle stage 460 and the reticle 420. In this way, the plurality of gas openings 450 of the reticle 400 are connected to the tube 510 via the chambers 482 of the reticle stage 460.

FIG. 10 shows a view of another system 600 for protecting a reticle 400 from falling-on particles in accordance with another embodiment of the present disclosure. The system 600 as shown in FIG. 10 includes an air wall generator 610 in addition to a system 500 as shown in FIGS. 5-7. The system 500 is configured to create an air wall 405 to protect the reticle 400 against falling-on particles (such as P1) as explained with respect to FIGS. 5-7. The air wall generator 610 may include gas openings and other things to create another air wall 605 that horizontally extends to provide an additional protection to the reticle 400 against falling-on particles (such as P2 in FIG. 10).

FIG. 11 shows a flowchart of a method 1100 of creating an air wall to protect a reticle 400 from falling-on particles in accordance with an embodiment of present disclosure. It is understood that additional operations can be provided before, during, and after the processes shown by FIG. 11, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

At S1101 of FIG. 11, in some embodiments, a gas 503 is supplied from a gas supply 530 to the plurality of gas openings 250 via a plurality of tubes 510 (in FIGS. 5A-5C) respectively. In some embodiments, a gas 503 supplied from the gas supply 530 includes a helium gas, an argon gas, a xenon gas, a nitrogen gas, a clean dry air (CDA), a combination of argon and hydrogen gases, a combination of nitrogen and hydrogen gases, or the like.

At S1102 of FIG. 11, in some embodiments, a gas 403 is blown from each of the plurality of gas openings 450 in the first direction Q away from the front surface 440 of the reticle 400 (as shown in FIGS. 4B and 5-7). In some embodiments, the angle α formed between the first direction Q and the reticle center axis C is in a range from about 25 degrees to about 50 degrees. In other embodiments, the angle α is in a range from about 30 degrees to about 45 degrees. In still other embodiments, the angle α is in a range from about 35 degrees to about 40 degrees.

At S1103 of FIG. 11, in some embodiments, as shown in FIGS. 5-7, a pressure of the gas entering into the plurality of gas openings 450 and a flow speed of the gas blown through the plurality of gas openings 450 is adjusted by a gas pump 520. In some embodiments, a controller 540 is coupled to and controls the gas supply 530 and the gas pump 520. In some embodiments, the pressure of the gas 503 entering into the plurality of gas openings 450 is in a range from about 0.5 atm to about 1.5 atm. In some embodiments, the flow speed of the gas 403 blown through the plurality of gas openings 450 is in a range from about 1 liter/minute to about 5 liter/minute.

At S1104 of FIG. 11, in some embodiments, the air wall 405 is created to surround and adjacent to the front surface 440 of the reticle 400. In some embodiments, as shown in FIG. 4B, a distance D2 between an outmost point of the air wall 405 and an outmost point of the front surface 440 is in a range from about 5 mm to about 6 mm.

Therefore, the created protection air wall 405 can advantageously prevent particles from falling on the front surface 440 of the reticle 400, and improve the cleanness of the retile, thereby raising wafer yield by about 0.5%.

FIGS. 12A and 12B illustrate an apparatus for creating an air wall to protect a reticle from falling-on particles in accordance with some embodiments of the present disclosure.

FIG. 12A is a schematic view of a computer system that performs the functions of an apparatus for creating an air wall to protect a reticle from falling-on particles. All of or a part of the processes, method and/or operations of the foregoing embodiments can be realized using computer hardware and computer programs executed thereon. In FIG. 12A, a computer system 1200 is provided with a computer 1201 including an optical disk read only memory (e.g., CD-ROM or DVD-ROM) drive 1205 and a magnetic disk drive 1206, a keyboard 1202, a mouse 1203, and a monitor 1204.

FIG. 12B is a diagram showing an internal configuration of the computer system 1200. In FIG. 12B, the computer 1201 is provided with, in addition to the optical disk drive 1205 and the magnetic disk drive 1206, one or more processors, such as a micro processing unit (MPU) 1211, a ROM 1212 in which a program such as a boot up program is stored, a random access memory (RAM) 1213 that is connected to the MPU 1211 and in which a command of an application program is temporarily stored and a temporary storage area is provided, a hard disk 1214 in which an application program, a system program, and data are stored, and a bus 1215 that connects the MPU 1211, the ROM 1212, and the like. Note that the computer 1201 may include a network card (not shown) for providing a connection to a LAN.

The program for causing the computer system 1200 to execute the functions for creating an air wall to protect a reticle from falling-on particles in the foregoing embodiments may be stored in an optical disk 1221 or a magnetic disk 1222, which are inserted into the optical disk drive 1205 or the magnetic disk drive 1206, and transmitted to the hard disk 1214. Alternatively, the program may be transmitted via a network (not shown) to the computer 1201 and stored in the hard disk 1214. At the time of execution, the program is loaded into the RAM 1213. The program may be loaded from the optical disk 1221 or the magnetic disk 1222, or directly from a network. The program does not necessarily have to include, for example, an operating system (OS) or a third party program to cause the computer 1201 to execute the functions of the control system for cleaning reticles and projecting layout patterns of the cleaned reticles in the foregoing embodiments. The program may only include a command portion to call an appropriate function (module) in a controlled mode and obtain desired results.

According to some embodiments of the present disclosure, a reticle comprises: a pattern section comprising a plurality of patterns thereon; a border section surrounding the pattern section; and a plurality of gas openings arranged in and passing through the border section and to be coupled to a gas supply, wherein each gas opening extends in a first direction tilted to and forming an angle with a reticle center axis extending perpendicularly outside a front surface of the reticle, and configured to blow a pressurized gas in the first direction to create an air wall surrounding and adjacent to the front surface. In an embodiment, the angle between the first direction and the reticle center axis is in a range from about 25 degrees to about 50 degrees. In an embodiment, the plurality of gas openings are in gas connection with the gas supply via a plurality of tubes respectively. In an embodiment, a shape of each gas opening is a rectangle with rounded corners. In an embodiment, the reticle center axis extends approximately in a gravity direction. In an embodiment, a distance between two adjacent gas openings of the plurality of gas openings is in a range from about 20 mm to about 40 mm. In an embodiment, wherein a ratio of a total area of the plurality of gas openings to an area of the border section of the reticle is in a range from about 40% to about 75%.

According to some embodiments of the present disclosure, a system comprises a gas supply; a reticle comprising a pattern section including a plurality of patterns, and a border section surrounding the pattern section; and a plurality of gas openings arranged in and passing through the border section and coupled to the gas supply via a plurality of tubes respectively, wherein each gas opening extends in a first direction inclined to a reticle center axis that extends perpendicularly away from a front surface of the reticle, and is configured to blow a pressurized gas in the first direction away from the front surface to create the air wall adjacent to and surrounding the front surface. In an embodiment, an angle formed between the first direction and the reticle center axis is in a range from about 30 degrees to about 45 degrees. In an embodiment, a shape of each gas opening is selected from the group consisting of a rectangle, a square, a circle, and an ellipse. In an embodiment, a size of each gas opening is in a range from about 45 mm$^2$ to about 55 mm$^2$. In an embodiment, the pressurized gas comprises a combination of an argon gas and a hydrogen gas, wherein a volume ratio of the argon gas and the hydrogen gas in the combination is in a range from about 0.8 to about 1.2. In an embodiment, the reticle center axis extends approximately in a gravity direction. In an embodiment, a distance between an outmost point of the air wall and an outmost point of the front surface is in a range from about 5 mm to about 6 mm. In an embodiment, the system further comprises a gas pump coupled to the plurality of gas openings and the gas supply; and a controller coupled to and configured to control the gas pump and the gas supply to adjust a pressure and a flow speed of the pressurized gas.

According to some embodiments of the present disclosure, a method of creating an air wall to protect a reticle, wherein the reticle comprises a plurality of gas openings in a border section thereof, the border section surrounding a pattern section including a plurality of patterns thereon, each gas opening extending in a first direction inclined to a reticle center axis extending perpendicularly away from a front surface of the reticle, the method comprises: supplying a pressurized gas from a gas supply to the plurality of gas openings via a plurality of tubes respectively; blowing the pressurized gas from each gas opening in the first direction away from the front surface; adjusting a pressure and a flow speed of the pressurized gas by a gas pump; and creating the air wall adjacent to and surrounding the front surface. In an embodiment, an angle formed between the first direction and the reticle center axis is in a range from about 35 degrees to about 40 degrees. In an embodiment, the pressurized gas is selected from the group consisting of a helium gas, an argon gas, a xenon gas, a nitrogen gas, a clean dry air (CDA), a combination of argon and hydrogen gases, and a combination of nitrogen and hydrogen gases. In an embodiment, the pressure of the pressurized gas is in a range from about 0.5 atm to about 1.5 atm. In an embodiment, the flow speed of the pressurized gas blown through the plurality of gas openings is in a range from about 1 liter/minute to about 5 liter/minute.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle comprising:
   a pattern section comprising a plurality of patterns thereon;
   a border section surrounding the pattern section; and
   a plurality of gas openings arranged in and passing through the border section and to be coupled to a gas supply,
   wherein each gas opening extends in a first direction tilted to and forming an angle with a reticle center axis extending perpendicularly outside a front surface of the reticle, and is configured to blow a pressurized gas in the first direction to create an air wall surrounding and adjacent to the front surface.

2. The reticle of claim 1, wherein the angle between the first direction and the reticle center axis is in a range from about 25 degrees to about 50 degrees.

3. The reticle of claim 1, wherein the plurality of gas openings are in gas connection with the gas supply via a plurality of tubes respectively.

4. The reticle of claim 1, wherein a shape of each gas opening is a rectangle with rounded corners.

5. The reticle of claim 1, wherein the reticle center axis extends approximately in a gravity direction.

6. The reticle of claim 1, wherein a distance between two adjacent gas openings of the plurality of gas openings is in a range from about 20 mm to about 40 mm.

7. The reticle of claim 1, wherein a ratio of a total area of the plurality of gas openings to an area of the border section of the reticle is in a range from about 40% to about 75%.

8. A system comprising:
a gas supply;
a reticle comprising a pattern section including a plurality of patterns, and a border section surrounding the pattern section; and
a plurality of gas openings arranged in and passing through the border section and coupled to the gas supply via at least one tube respectively,
wherein each gas opening extends in a first direction inclined to a reticle center axis that extends perpendicularly away from a front surface of the reticle, and is configured to blow a pressurized gas in the first direction away from the front surface to create an air wall adjacent to and surrounding the front surface.

9. The system of claim 8, wherein an angle formed between the first direction and the reticle center axis is in a range from about 30 degrees to about 45 degrees.

10. The system of claim 8, wherein a shape of each gas opening is selected from the group consisting of a rectangle, a square, a circle, and an ellipse.

11. The system of claim 8, wherein a size of each gas opening is in a range from about 45 mm$^2$ to about 55 mm$^2$.

12. The system of claim 8, wherein the pressurized gas comprises a combination of an argon gas and a hydrogen gas, and wherein a volume ratio of the argon gas and the hydrogen gas in the combination is in a range from about 0.8 to about 1.2.

13. The system of claim 8, further comprising a reticle stage for holding the reticle and having a chamber therein, wherein the chamber of the reticle stage is coupled to the plurality of gas openings of the reticle and is coupled to the at least one tube.

14. The system of claim 8, wherein a distance between an outmost point of the air wall and an outmost point of the front surface is in a range from about 5 mm to about 6 mm.

15. The system of claim 8, further comprising:
a gas pump coupled to the plurality of gas openings and the gas supply; and
a controller coupled to and configured to control the gas pump and the gas supply to adjust a pressure and a flow speed of the pressurized gas.

16. A method of creating an air wall to protect a reticle, wherein the reticle comprises a plurality of gas openings in a border section thereof, the border section surrounding a pattern section including a plurality of patterns thereon, each gas opening extending in a first direction inclined to a reticle center axis extending perpendicularly away from a front surface of the reticle, the method comprising:
supplying a pressurized gas from a gas supply to the plurality of gas openings via a plurality of tubes respectively;
blowing the pressurized gas from each gas opening in the first direction away from the front surface;
adjusting a pressure and a flow speed of the pressurized gas by a gas pump; and
creating the air wall adjacent to and surrounding the front surface.

17. The method of claim 16, wherein an angle formed between the first direction and the reticle center axis is in a range from about 35 degrees to about 40 degrees.

18. The method of claim 16, wherein the pressurized gas is selected from the group consisting of a helium gas, an argon gas, a xenon gas, a nitrogen gas, a clean dry air (CDA), a combination of argon and hydrogen gases, and a combination of nitrogen and hydrogen gases.

19. The method of claim 16, wherein the pressure of the pressurized gas is in a range from about 0.5 atm to about 1.5 atm.

20. The method of claim 16, wherein the flow speed of the pressurized gas blown through the plurality of gas openings is in a range from about 1 liter/minute to about 5 liter/minute.

* * * * *